United States Patent [19]

Zavracky

[11] Patent Number: 5,638,946
[45] Date of Patent: Jun. 17, 1997

[54] MICROMECHANICAL SWITCH WITH INSULATED SWITCH CONTACT

[75] Inventor: Paul M. Zavracky, Norwood, Mass.

[73] Assignee: Northeastern University, Boston, Mass.

[21] Appl. No.: 585,407

[22] Filed: Jan. 11, 1996

[51] Int. Cl.$^6$ .................................................. H01H 57/00
[52] U.S. Cl. .................................... 200/181; 73/514.16
[58] Field of Search .............................. 200/16 B, 16 D, 200/83 N, 181, 512, 61.48, 262–270, 275; 73/514.16, 514.36, 514.37; 257/414–467; 361/283.1–283.4

[56] References Cited

U.S. PATENT DOCUMENTS

| | | | |
|---|---|---|---|
| 4,356,730 | 11/1982 | Cade | 73/514.26 |
| 4,402,131 | 9/1983 | Roberts | 29/622 |
| 4,472,239 | 9/1984 | Johnson et al. | 437/7 |
| 4,480,162 | 10/1984 | Greenwood | 200/181 |
| 4,543,457 | 9/1985 | Petersen et al. | 200/83 N |
| 4,570,139 | 2/1986 | Kroll | 335/187 |
| 4,624,137 | 11/1986 | Johnson et al. | 73/204.26 |
| 4,651,564 | 3/1987 | Johnson et al. | 73/204.26 |
| 4,674,180 | 6/1987 | Zavracky et al. | 29/622 |
| 4,681,403 | 7/1987 | Te Velde et al. | 359/58 |
| 4,696,188 | 9/1987 | Higashi | 73/204.19 |
| 4,721,925 | 1/1988 | Farace et al. | 331/154 |
| 4,736,202 | 4/1988 | Simpson et al. | 340/825.81 |
| 4,794,370 | 12/1988 | Simpson et al. | 340/825 |
| 4,849,070 | 7/1989 | Bly et al. | 216/17 |
| 4,855,544 | 8/1989 | Glenn | 200/61.45 R |
| 4,959,515 | 9/1990 | Zavracky et al. | 200/181 |
| 4,966,037 | 10/1990 | Sumner et al. | 73/204.26 |
| 4,979,149 | 12/1990 | Popovic et al. | 365/244 |
| 5,016,072 | 5/1991 | Greiff | 257/418 |
| 5,126,812 | 6/1992 | Greiff | 257/417 |
| 5,129,983 | 7/1992 | Greiff | 216/2 |
| 5,182,910 | 2/1993 | Benecke | 60/529 |
| 5,216,490 | 6/1993 | Greiff et al. | 73/514.35 |
| 5,226,099 | 7/1993 | Mignardi et al. | 385/19 |
| 5,258,591 | 11/1993 | Buck | 200/181 |
| 5,262,000 | 11/1993 | Welbourn et al. | 216/2 |
| 5,271,075 | 12/1993 | Gfeller et al. | 385/20 |
| 5,278,368 | 1/1994 | Kasano et al. | 200/181 |
| 5,294,760 | 3/1994 | Bower et al. | 200/83 N |
| 5,331,852 | 7/1994 | Greiff et al. | 73/504.09 |
| 5,349,855 | 9/1994 | Bernstein et al. | 73/504.16 |
| 5,367,878 | 11/1994 | Muntz et al. | 60/512 |
| 5,374,792 | 12/1994 | Ghezzo et al. | 200/16 B |
| 5,408,877 | 4/1995 | Greiff et al. | 73/504.12 |
| 5,431,051 | 7/1995 | Biebl et al. | 73/517 R |
| 5,447,600 | 9/1995 | Webb | 216/2 |
| 5,463,233 | 10/1995 | Norling | 257/254 |
| 5,467,068 | 11/1995 | Field et al. | 335/4 |

Primary Examiner—J. R. Scott
Attorney, Agent, or Firm—Weingarten, Schurgin, Gagnebin & Hayes LLP

[57] ABSTRACT

A micromechanical switch and a method of making the switch. The micromechanical switch of the invention is made by surface micromachining techniques and include an isolated contact located on the beam and separated from the main body of the beam by an insulated connector. The isolated contact provides the advantage that the current flow caused by the circuit being switched does not alter the fields or currents used to actuate the switch. Thus, the present invention allows the actuation functions to be unaffected by the signals that are being switched.

14 Claims, 8 Drawing Sheets

Deposit and pattern lower metal layer.

Deposit and pattern 1st sacrificial

Deposit and pattern 2nd sacrificial

Deposit and pattern beam.

Deposit and pattern Insulator.

Remove Sacrificial layers.

Deposit and pattern lower metal layer.

Deposit and pattern 1st sacrificial

Deposit and pattern 2nd sacrificial

Deposit and pattern upper electrodes and contact layers.

Deposit and pattern Insulator.

Remove Sacrificial layers.

5,638,946

MICROMECHANICAL SWITCH WITH INSULATED SWITCH CONTACT

FIELD OF THE INVENTION

This invention relates to micromechanical devices, and more particularly to micromechanical switches made by micromachining techniques.

BACKGROUND OF THE INVENTION

Electronic measurement and testing systems use relays to route analog signals. Switching devices used in these systems are required to have a very high off-resistance and a very low on-resistance. MOS analog switches have the disadvantage of non-zero leakage current and high on-resistance.

An example of a prior art microswitch is illustrated in FIG. 1A at 10. The basic structure is a micromechanical switch that includes a source contact 14, a drain contact 16, and a gate contact 12. A conductive bridge structure 18 is attached to the source contact 14. As shown in FIG. 1B, the bridge structure 18 overhangs the gate contact 12 and the drain contact 16 and is capable of coming into mechanical and electrical contact with the drain contact 16 when deflected downward. Once in contact with the drain contact 16, the bridge 18 permits current to flow from the source contact 14 to the drain contact 16 when an electric field is applied between the source and the drain. Thus, the voltage on the gate 12 controls the actuation of the device by generating an electric field in the space 20. With a sufficiently large voltage in the space 20, the switch closes and completes the circuit between the source and the drain by deflecting the bridge structure 18 downwardly to contact the drain contact 16.

Switches of this type are disclosed in U.S. Pat. No. 4,674,180 to Zavracky et al., the whole of which is incorporated by reference herein. In this device, a specific threshold voltage is required to deflect the bridge structure so that it may contact the drain contact. Once the bridge comes into contact with the drain contact, current flow is established between the source and the drain.

During operation, hysteresis can arise if the voltage required to draw the end of the beam into contact with the drain contact is greater than that required to hold it in contact with the drain. Thus, two modes of operation exist—a hysteretic mode and a non-hysteretic mode. In a hysteretic mode, when the switch is closed, the gap between the beam and the gate is reduced and therefore the gate voltage required to maintain the beam in its downward deflected state is less than the gate voltage required to actuate the switch. To release the beam so that the beam returns to its open state requires a reduction in the gate voltage to a level below not only the gate voltage required to deflect the beam, but also less than the gate voltage required to maintain the beam in its deflected position. A non-hysteretic mode of operation occurs when the switches are employed. The switches have a minimum gate actuation voltage approximately equal to the maximum gate release voltage due in part to the longer beam length and larger gate area.

Another consideration is that the drain end of the switch may also experience an electrostatic force for high drain/source voltages. Increasing the drain/source voltage above a critical value will cause an unstable operation of the device. This effect is the equivalent of breakdown in a solid state device. To obtain consistent performance the source must always be grounded, or the driving potential between the source and the gate must be floating relative to the source potential. However, this arrangement is not acceptable for many applications.

Several microrelays have been described in the prior art. U.S. Pat. No. 5,278,368 to Kasano et al. discloses an electrostatic relay having an insulated beam. Kasano utilizes a gate contact disposed above the beam with a source contact disposed below the beam. With this arrangement, the beam can be deflected downward to provide electrical connection between two contacts. The manufacture of such a device requires the construction and alignment of several layers of conductors and insulators. Additional conductors are disposed above and below the beam, and as such, the drain contact is not part of the electric field generation mechanism. In this arrangement, the beam is connected to an insulator to provide an electric field generation mechanism.

Several investigators have reported the application of micromachining to the fabrication of mechanical switches and microrelays. Petersen (IBM J. Res. Dev. 23 376–85 (1979)) reported the use of bulk micromachined silicon dioxide cantilevers as relay prototypes. In this work, the cantilever is suspended over an anisotropically etched cavity in the bulk silicon, and a plated metal beam attached to the end of the cantilever makes electrical contact when the beam is pulled down electrostatically.

Zavracky and Morrison reported the first surface micromachined switches. These devices were two terminal devices with a resistor placed between the contacts. This arrangement permits the actuation of the device and source current from the same supply.

Hosaka et al. (Proc IEEE MEMS Workshop '93, Fort Lauderdale, Fla., 12-7 (1993) have developed micromechanical multicontact relays that are electromagnetically actuated. The use of electromagnetic actuation restricts the extent to which the device can be miniaturized. The size limitation also places a limit on the switching speed achievable by such devices.

Sakata et al. (Proc. IEEE MEMS Workshop '89, Salt Lake City, Utah, 149-51 (1989)) reported a micromechanical relay using a silicon cantilever pivoted at its middle, suspended over a cavity anisotropically etched in bulk silicon.

Drake at al. (Transducers '95 Eurosensors IX, Stockholm, Sweden (1995)) have reported using a polysilicon bridge structure as the switching element. The bridge is suspended over a cavity etched in the silicon substrate. The electrodes are deposited and patterned on a separate wafer, and the two wafers are bonded together.

Gretillat et al. (J. Micromech. Microeng. 5, 156–160 (1995)), have used a polysilicon/silicon nitride/polysilicon bridge as the mechanical element. The bridge is released from the insulating silicon nitride substrate by surface micromachining.

Yao and Chang (Transducers '95 Eurosensors IX, Stockholm, Sweden (1995)) have reported a device using a silicon dioxide cantilever, released by surface micromachining from a semi-insulating GaAs substrate.

SUMMARY OF THE INVENTION

The invention is a micromechanical switch made by surface micromachining techniques that includes an isolated contact located on the beam and separated from the main body of the beam by an insulated connector. The advantage of using an isolated contact is that the current flow caused by the circuit being switched does not alter or affect the fields or currents used to actuate the switch. Thus, the present invention allows the actuation functions of the switch to be isolated from the currents being switched.

In one embodiment, the invention features a micromechanical switch comprising a source contact, a gate contact, and a drain contact, all three contacts being mounted on a substrate. A beam is connected to the source contact and includes a beam body, a beam contact, and an insulator. The beam body overhangs the gate contact and the beam contact overhangs the drain contact. The insulator joins and electrically insulates the beam body from the beam contact such that during operation, the field used to actuate the switch that is established between the beam body and the gate contact is not affected by the switching when the beam contact electrically and mechanically connects the drain contacts to each other.

In another embodiment, the invention features an insulated micromechanical switch comprising a substrate, a source electrode mounted on the substrate, a gate contact having a first gate electrode and a second gate electrode, the gate contact mounted on the substrate adjacent to the source electrode, the first gate electrode and the second gate electrode separated by a channel. A drain electrode is mounted on the substrate adjacent to the gate contact, and a beam is mounted on the source electrode and overhangs the gate contacts and electrodes and the drain electrode. The beam comprises an upper electrode layer and an upper contact layer, the upper electrode layer positioned on the underside of the beam and over the gate contact, and the upper contact layer positioned on the underside of the beam and over the drain electrode. In this embodiment, the beam itself is made of nonconductive material and electrically insulates the upper contact layer from the upper electrode layer.

The invention also features a micromechanical switch in which two beam contacts share a common end and insulated contacts are positioned on opposing ends. Such an arrangement allows for a "see-saw" type motion, i.e., when one portion of the switch is in contact, the other portion is not.

The invention also features two beam contacts and gates linked by a common insulated contact. Such an arrangement results in a bridge-like structure that permits the common insulated contact to be actuated by either of the two gate electrodes.

An important feature of the device of the invention is that the beam length is approximately two orders of magnitude smaller than devices known in the prior art, e.g., 5–20 micrometers. The shorter beam length results in higher frequencies of oscillation. Thus, the devices of the present invention are capable of providing switching action at higher rates than that found in prior art devices. Accordingly, the devices of the present invention can be used as more than mere shunts, for example, in combinations to form logic circuits, in high-temperature applications, in radiation hardened applications, and as high-speed relays.

The invention also features methods of making an insulated micromechanical switch comprising the steps of depositing a lower contact layer on a substrate to form a lower contact layer comprising a source contact area, a gate contact area and a drain contact area, depositing sacrificial layers onto the lower contact layer, depositing beam material to form a beam body and a beam contact onto the second sacrificial layer, depositing insulating material between the beam body and the beam contact to join and electrically insulate the beam body and the beam contact, and removing the sacrificial layers.

In another embodiment, the method of making the insulated micromechanical switch of the invention features the steps of depositing a lower contact layer on a substrate, the lower contact layer comprising a source contact area, a gate contact area and a drain contact area. Sacrificial layers are deposited onto the lower contact layer, and an upper electrode layer and an upper contact layer are deposited on the second sacrificial layer, the upper electrode layer positioned above the gate contact area, and the upper contact layer positioned above the drain contact area. Insulating beam material is next deposited on the upper electrode layer and the upper contact layer to form an insulating beam that insulates the upper electrode layer from the upper contact layer. The first sacrificial layer and the second sacrificial layer are removed to produce an insulated micromechanical switch.

Applications for such a device include logic gates such as NAND gates, NOR gates, inverters and the like. Since the micromechanical switch of the invention operates at as much as one hundred times lower power consumption than an equivalently sized CMOS circuit, due to the smaller gate capacitances of the micromechanical switch, the micromechanical switch can also be used in applications requiring low power. The micromechanical switches feature a high "off" impedance ($>10^{15}$ ohms) and a low "on" impedance ($<1$ ohm). The micromechanical switches are able to operate a frequencies above 1 MHz. The micromechanical switches further feature a small size, with the size ranging from less than 10 microns long to over 1 mm long, and are electrostatically actuated at between 5 volts and 200 volts. The micromechanical switches are also radiation hard, i.e., they are much less sensitive to radiation as compared to electronic devices. Additionally, the micromechanical switches are inherently temperature insensitive, therefore making them suitable for high or low temperature operation. Accordingly, the devices of the present invention can operate in a wide variety of environments, at less power, and at higher frequencies than prior art devices.

Micromechanical switches of the present invention can be switched at frequencies of approximately 2 MHz for devices featuring a beam length of 10 μm, a beam width of 2 μm, a beam thickness of 0.4 μm and a beam-to-gate spacing of 0.4 μm. A beam of this size has a resistance of approximately 0.55 ohms. The turn-on voltage for such a device is approximately 29 volts, and the turn-off voltage is equal to approximately 16 volts.

As used herein, "process control" includes both individual variable processes and complex processes involving a large number of controlled process conditions such as fluid flow, flow rate, temperature, pressure, level, and the like. "Shunt" is used in describing the present invention in the sense of providing a lower current pathway connecting two points, which points are not necessarily parallel with another current path. "Hysteresis" is defined as the lagging of a physical effect on a body behind its cause after the causal force is changed in value or removed. As defined herein, "micromachining" includes the techniques of planar technology, wet chemical etching and other etching techniques, metallization, and metal deposition. "Planar technology" includes the various techniques used in integrated circuit fabrication, such as photolithography, oxide etching, thermal diffusion, ion implantation, chemical vapor deposition, and dry plasma etching. "Stiction" refers to the phenomenon wherein two or more electrically conductive elements irreversibly come into contact.

DESCRIPTION OF THE DRAWINGS

The invention will be more fully understood from the following detailed description taken in conjunction with the accompanying drawings in which.

DETAILED DESCRIPTION OF THE INVENTION

Figure 1A:
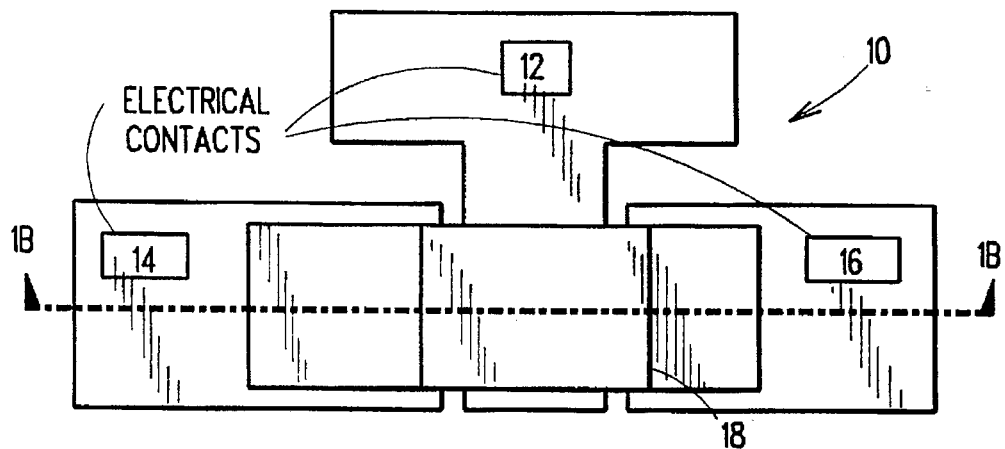
FIG. 1A is a top view of a micromechanical switch of the prior art.
Figure 1B:
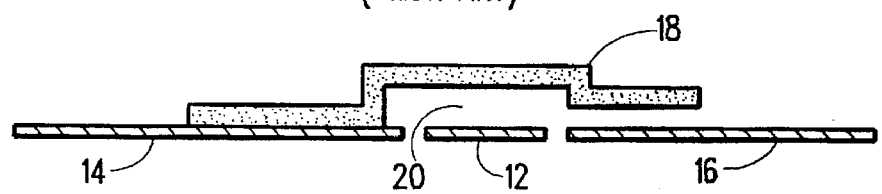
FIG. 1B is a side view of the micromechanical switch shown in FIG. 1A cut along line AA'.
Figure 2A:
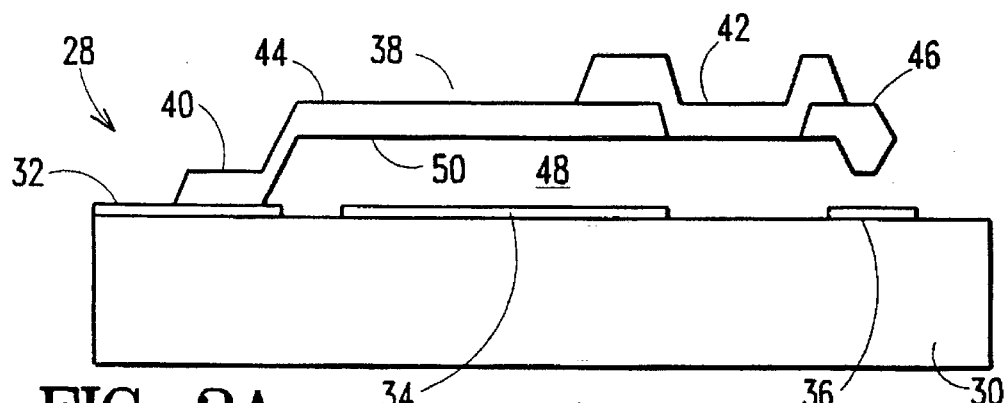
FIG. 2A is a side view of an embodiment of the present invention.
Figure 2B:
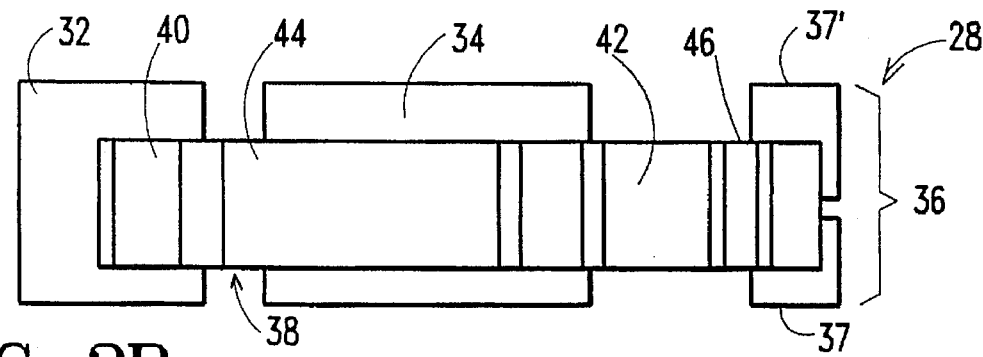
FIG. 2B is a top view of the embodiment of the invention shown in FIG. 2A.

One embodiment of the invention is illustrated in FIGS. 2A and 2B. This embodiment illustrates the invention as a micromechanical switch 28 that includes a substrate 30, and a series of contacts mounted on the substrate. The contacts include a source contact 32, a gate contact 34, and a drain contact 36. The drain contact 36 is made up of two separate contacts 37 and 37'. A beam 38 is attached at one end 40 to the source contact 32 and permits the beam to hang over the substrate. The beam is of sufficient length to overhang both the gate contact 34 and the drain contact 36. The beam 38 illustrated in FIGS. 2A and 2B includes an insulative element 42 that joins and electrically insulates the beam body 44 from the beam contact 46. In operation, actuation of the switch permits the beam contact to connect the two separate contacts 37 and 37' of the drain contact 36 and allow current to flow from one separate drain contact to the other.

The beam length of the present invention is an important parameter that affects the switching frequency of the microrelay. Beam length according to the invention is in the range of approximately 5 to 20 micrometers. These dimensions provide a concomitant increase in the frequency (i.e., the number of on-off cycles) that the switch can be used.

In one embodiment, the substrate material of the micromechanical switch of the invention may be made of glass, silicon, or other substrate known in the electrical arts. The beam material in this embodiment is preferably nickel. However other platable materials such as gold, chrome, chromium, copper and/or iron may also be used. Preferably, the insulator is a polyamide or polymethyl methacrylate (PMMA). However, other insulative materials, such as silicon nitride, silicon oxide, or other insulative material, may be substituted. In one embodiment, the insulator 42 has a length ranging from approximately 100 Å to 10 mm, a width from of approximately 100 Å to 10 mm, and a thickness from approximately 100 Å to 100 μm. The source contact 32, gate contact 34, and drain contact 36 may be any conductive metal, such as platinum, palladium, gold, or other conductive metal known in the art. The contacts 32, 34, and 36 may be deposited on the substrate by any method known in the art, such as sputtering, chemical vapor deposition, or the like. The materials for contacts 32, 34 and 36 are preferably compatible with the sacrificial layers (described below) and not with other metals.

Figure 2C:
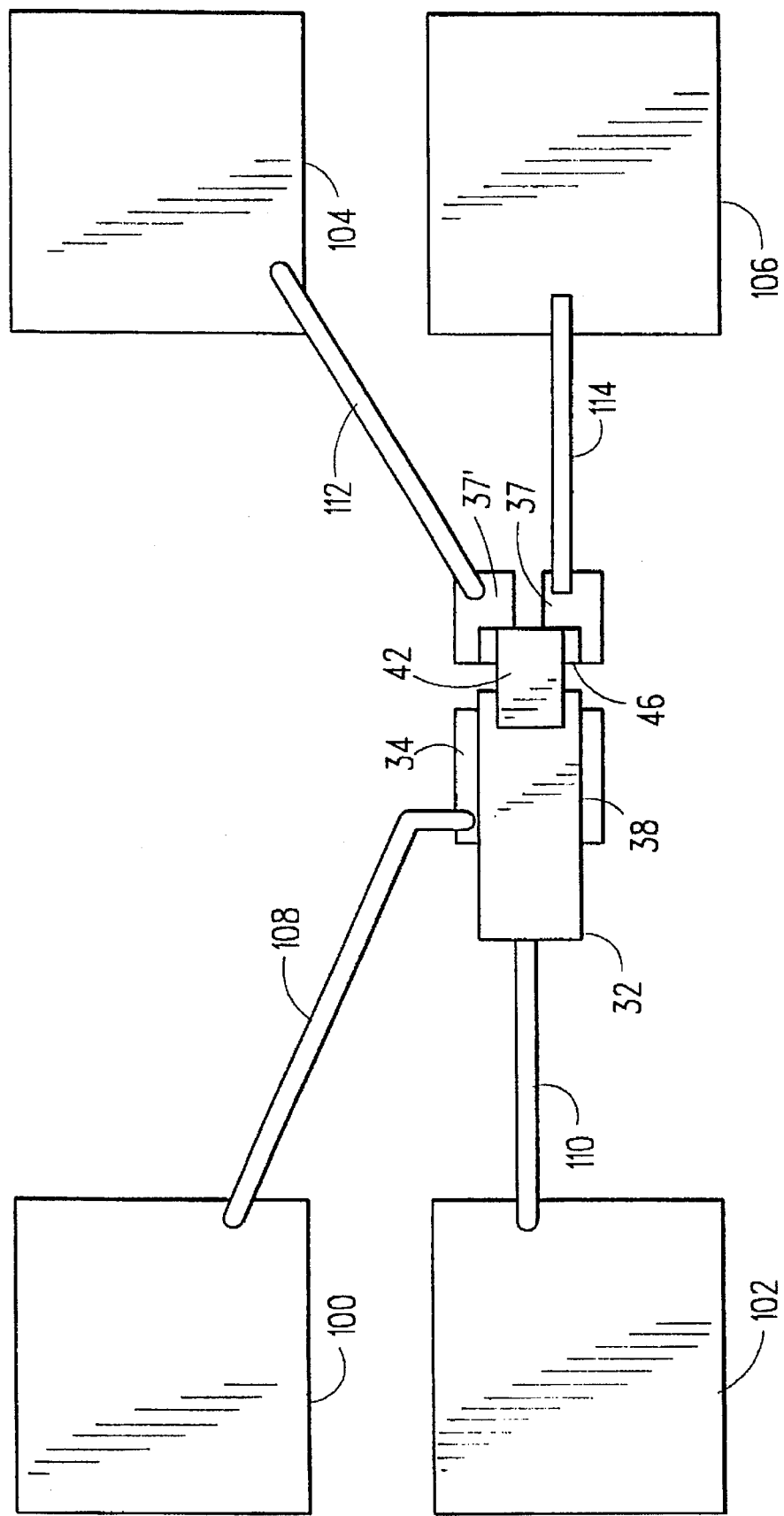
FIG. 2C is a top view of an embodiment of the invention installed in a circuit.

FIG. 2C illustrates a simple circuit in which the device illustrated in FIGS. 2A and 2B (shown in top view) is implemented. The circuit includes bonding pads 100, 102, 104 and 106 which allow bonding wires (typically gold or aluminum) to be bonded to the pads to allow for interconnectivity outside the device. Bonding pads 100 and 102 connected to the switch by connections 108 and 110, respectively. Bonding pad 104 is electrically connected to drain contact 37' by connection 112. Similarly, bonding pad 106 is electrically connected to drain contact 37 by connection 114. The bonding pads 100 and 102 supply current for the gate contact 34 and the source contact 32, respectively.

The beam 38 includes an insulative element 42 that electrically insulates the beam 38 from the beam contact 46. When a threshold electric field is established in the gate contact by sources 100 and 102, the beam 38 is deflected downwardly and allows the beam contact to complete an electrical connection between the two segments of the drain contact 37 and 37' and allows bonding pads 104 and 106 to establish electrical communication. Thus, the insulative element permits sources 100 and 102 to actuate the switch independently from bonding pads 104 and 106. Since the elements of the switch that manipulate the beam do not come into physical contact and are electrically insulated from the portion of the beam that governs electrical communication between the two circuits being switched, the functions of actuation and contacts are separated.

Figure 3A:
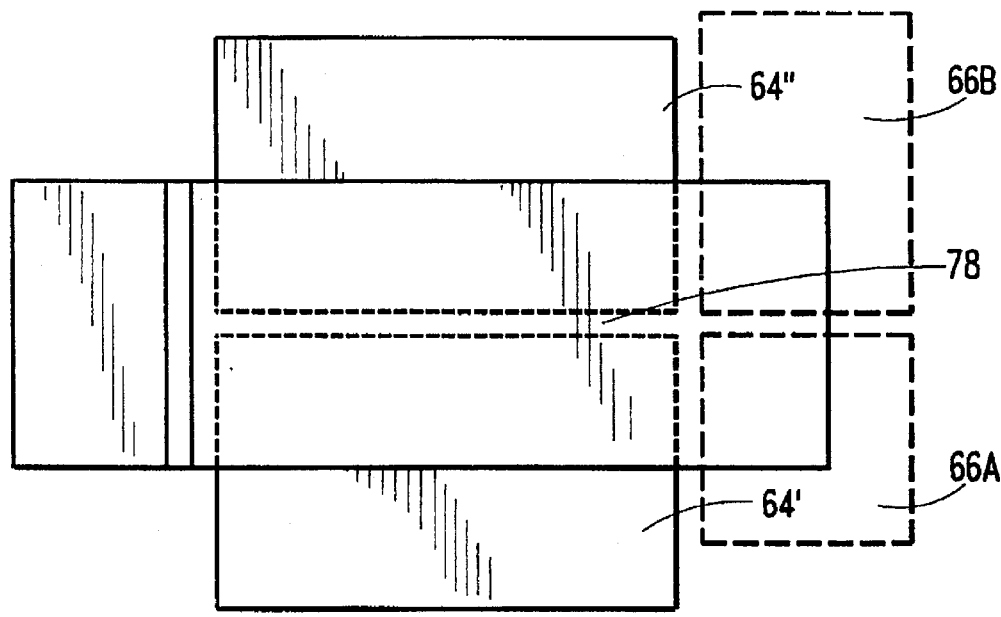
FIG. 3A is a top view of an alternative embodiment of the invention.
Figure 3B:
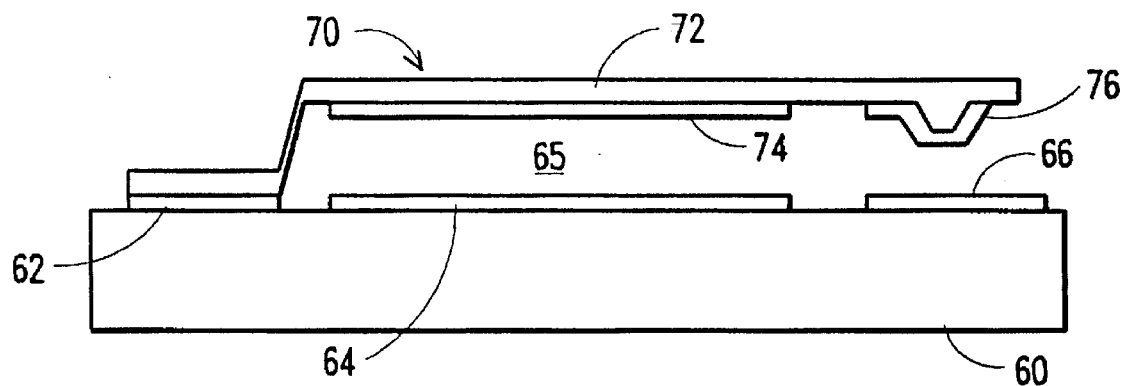
FIG. 3B is a side view of the embodiment of the invention shown in FIG. 3A.

An alternative embodiment of the invention illustrated in FIGS. 3A and 3B includes a substrate 60, a source contact 62, a gate contact 64, and a drain contact 66 mounted in a similar arrangement as the embodiment illustrated in FIGS. 2A–2C. As shown in FIG. 3A, the drain contact 66 comprises two individual and separate contacts 66A and 66B. A beam 72 is attached to the source contact 62, though in another embodiment the beam 72 could be attached directly to the substrate. Beam 72 includes an upper isolated electrode 74 positioned over the gate contact 64 and a beam contact 76 positioned over the drain contact 66. The upper isolated electrode 74 and the beam contact 76 are attached to the lower surface of the beam 70 and are in close proximity to the gate contact 64 and drain contact 66, respectively. In this embodiment, the beam 72 is fabricated of insulative materials, such as a polyamide, PMMA, or other insulative materials, which results in no electrical contact between the upper isolated electrode 74 and the beam contact 76.

As shown in FIG. 3A, the gate contact 64 consists of two plates 64' and 64" that are positioned in close proximity to each other with a channel 78 separating the two plates. In use, an actuation voltage is applied between the two plates 64' and 64" and an electric field is established between both plates 64' and 64" and the upper isolated electrode 74. The embodiment of the invention shown in FIGS. 3A and 3B operates similarly to the embodiments shown in FIGS. 2A–C in that an electric field is established in the space 65 between the upper isolated electrode 74 and the gate contact 64. This electric field may be adjusted to result in deflection of the beam and subsequent contact of the beam contact 76 with the drain contact 66 resulting in electrical communication between the two drain contact electrodes 66A and 66B.

As mentioned above, the advantage of an isolated contact such as described herein is that the current being switched does not alter the fields used to actuate the switch. During operation, contact made between the isolated contact and the drain contact is not affected or influenced by the current flowing in the bridge. Thus, the isolated contact completes a circuit independently from the circuitry used to actuate the switch.

Figure 4:
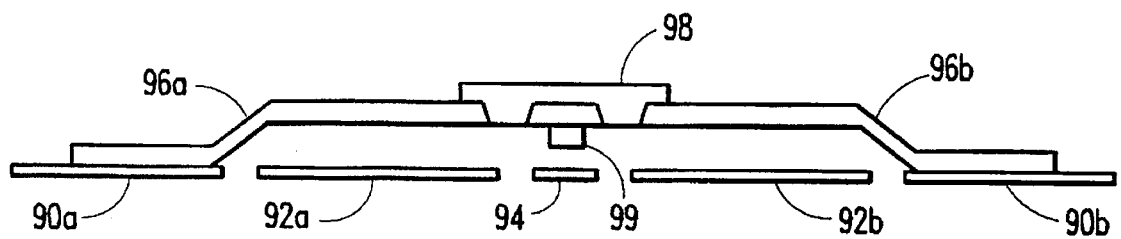
FIG. 4 is a side view of an alternative embodiment of the invention.

An alternative embodiment of the invention is shown in FIG. 4. In this embodiment, a single beam is formed by joining two independently operable beams at a common end. This embodiment includes a single insulated contact at the junction of the two beams and results in the single contact being manipulated by either of the two independently operating beams. As shown in FIG. 4, this embodiment includes two source contacts 90a and 90b, two gate contacts 92a and 92b, and two drain contact 94 and 94' (not shown). Each source contact 90a and 90b includes a beam 96a and 96b mounted thereon and positioned above the respective gate contacts 92a and 92b. The beams 96a and 96b are connected by a common insulative body 98 that joins the beams and prevents electrical communication between them. Alternatively, two individual insulators may be implemented in place of the single insulative body. Mounted within the insulative body 98 is a beam contact 99 that is electrically isolated from the beams 96a and 96b and is capable of coming into contact with drain contacts 94 and 94'. The insulative body 98 permits the beam contact 99 and drain contacts 94 and 94' to establish electrical communication without interference or influence by the electric fields established between the beams 96a and 96b and gate contacts 92a and 92b.

In operation, this embodiment permits two gates to independently actuate the same switch. An electric field may be established between either the beam 96a and gate contact 92a or the beam 96b and the gate contact 92b. In either situation, the beam contact is deflected downwardly to contact the drain contact 94 and the beam contact 99. Thus, the switch shown in FIG. 4 acts in a bridge-like fashion during actuation and can function as a logical OR gate.

Figure 5:
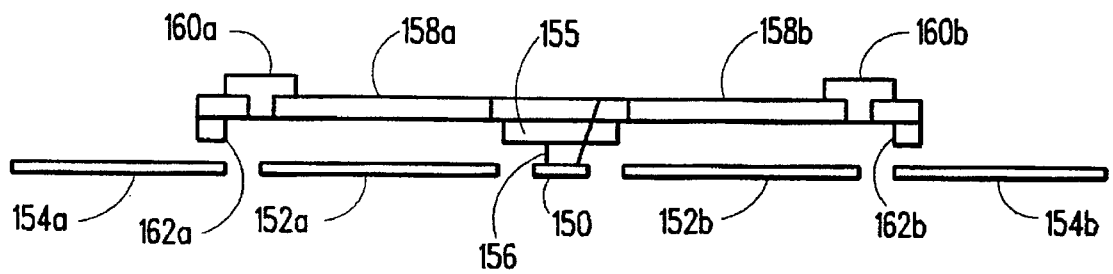
FIG. 5 is a side view of another alternative embodiment of the invention.

In another embodiment illustrated in FIG. 5, a switch may be formed as a cantilever attached at a common end. This embodiment includes a source contact 150, two gate contacts 152a and 152b, and two drain contacts 154a and 154b. A hinge 156 attaches the beams 158a and 158b to the source contact 150 via a corregation 155 to provide a voltage source. Thus, beams 158a and 158b form a single rigid piece with corregation 155 provided at the attachment point of the two beams to add strength. Each of the beams 158a and 158b includes an insulator 160a and 160b that connects the beams to electrically insulate the beams from the respective beam contacts 162a and 162b. As described hereinabove with respect to FIG. 2A–C, the insulators electrically insulate the beam contacts 162a and 162b from the electrically charged beams 158a and 158b. Like the embodiment described in FIG. 2, electric fields established between the beams 158a, 158b and the gate contacts 152a, 152b permit actuation of the switches independent of the currents being switched. Operation of one switch prevents operation of the other.

The performance and operation of the switches of the invention are based on the mechanical properties of the beam material and the electrostatic forces generated between the beam and the gate. The deflection of the beam $v_o$ due to a force W applied at the end of the beam may be expressed by the equation:

$$v_o = \frac{-Wl^3}{3EI} \quad (1)$$

where:

W is the applied load; l is the length of the cantilever; E is the Effective Young's modulus; and I is the moment of inertia.

Combining equation (1) with moment of inertia for a rectangular beam gives the following equation for the lumped spring constant of the beam:

$$k = \frac{bh^3E}{4l^3} \quad (2)$$

The structure of the beam and the underlying substrate approximate the parallel plates of a capacitor. The force between two parallel plates of a capacitor (ignoring fringing fields) can be expressed as:

$$F_E = \epsilon_o A \frac{V^2}{2d^2}$$

where:

d is the initial spacing between the electrodes; $\epsilon_o$ is the permittivity of free space; A is the area of one of the plates; and V is the applied voltage.

The force exerted by the electric field is counteracted by the spring force of the beam such that $$kv_o = \epsilon_o A \frac{V^2}{2[d-v_o]^2} \quad (4)$$

Figure 6:
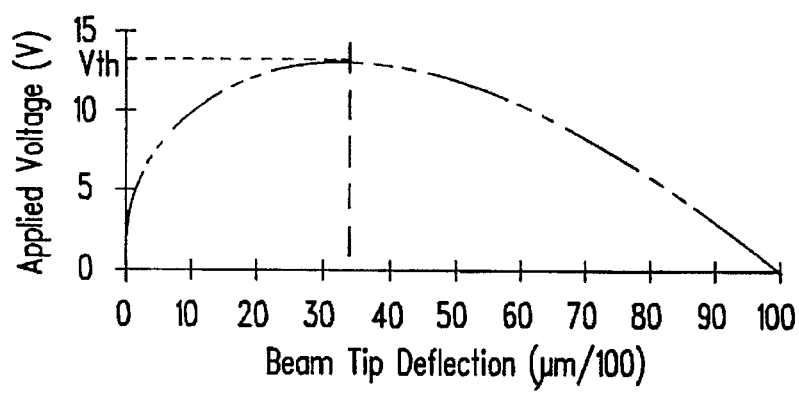
FIG. 6 is a graphical representation of the relationship between applied voltage and beam tip deflection.

This leads to the relationship between the voltage and the position $$V = [d - v_o] * \sqrt{2kv_o/\epsilon_o A} \quad (5)$$

which is plotted in FIG. 6. As can be seen in FIG. 6, for small $v_o$, the voltage required to hold a proof mass in position varies approximately as the square root of the distance. As the position increases, the voltage required to hold the proof mass increases monotonically, but at an ever decreasing rate. At a point approximately one third of the original distance, d, the slope dV/dx is zero. Further increases in the position require less holding voltage. Therefore, if the position were to increase beyond d/3, at a fixed voltage, the proof mass would continue to be accelerated until the force plates of the capacitor met. Therefore, for voltages above the maximum value ($V_{th}$) indicated on the FIG. 6, the system is unstable and the force plates collapse.

The threshold voltage $V_{th}$ may be expressed as:

$$V_{th} = \frac{2}{3} d * \sqrt{2 \frac{kd}{\epsilon_o A}} \quad (6)$$

The example here is for a rectangular beam. However, other more complex beam shapes could be conceived in which the force plate area is increased independently of the spring geometry. The gate capacitance and the threshold voltage are intimately coupled just as in a field effect transistor (FET), but the gap spacing which correlates to the gate oxide thickness cannot be completely absorbed into the capacitance term. Compared to FETs, the gate capacitance can be 100 to 500-fold smaller, and can be as much as 1000-fold smaller. In this case, $$V_{th} = \frac{2}{3} d * \sqrt{\frac{2k}{C_{gate}}} \quad (7)$$

The preferred method of making the micromechanical switches of the invention is micromachining. Micromachining involves the use of planar technology, wet chemical etching, metallization and metal deposition in order to fabricate mechanical devices which are smaller, more efficient and capable of large scale production at low cost as compared to other mechanical device manufacturing techniques.

Figure 7A:
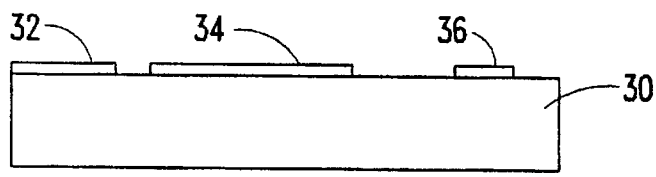
FIGS. 7A–7F show the steps of a method to make the embodiment of the invention shown in FIGS. 2A and 2B.

An overview of the process of micromachining used to create the structure shown in FIGS. 2A and 2B is illustrated in FIGS. 7A–7F. In this process, the source contact 32, the gate contact 34, and the drain contact 36 are deposited and patterned on a substrate 30 as shown in FIG. 7A. The substrate is generally glass, silicon, or other similar substrate used in the electrical arts. A preferred material for the contacts is titanium/tungsten and gold (TiW/Au) (e.g., 10% Ti, 90% W), although other conductive materials such as platinum (Pt), palladium (Pd), ruthenium (Ru) or rhodium (Rh) may also be implemented. The TiW layer is on top of the gold and is removed at the end of the process. The TiW layer makes patterning of the gold easier and more precise. The contacts may be deposited by any method used in the art, such as vacuum deposition, sputtering, or similar techniques. Typically, a layer of chrome is deposited (for adhesion purposes), followed by a layer of gold then a layer of titanium-tungsten, each of the layers being deposited in succession.

Photoresist is then spun on and patterned. Typically, the photoresist is spun on by placing the wafer on a spinner, spinning the wafer and adding a drop of liquid photoresist to the spinning wafer. The photoresist spins out and produces a thin, approximately uniform layer of photoresist material distributed across the wafer. The TiW, gold, and chrome layers are then etched using a commercial wet etchants. Other etching techniques, such as plasma etching, sputter etching, and reactive ion etching could also be used. The photoresist is then stripped off, and the TiW layer is also stripped off leaving the contacts.

Figure 7B:
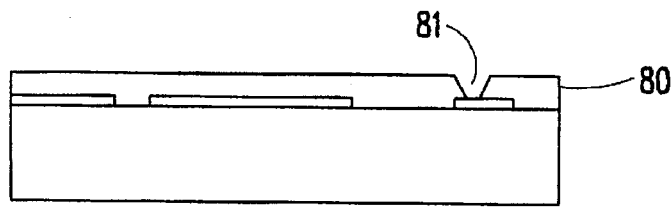

As shown in FIG. 7B, a first sacrificial layer 80 is next deposited and patterned over the substrate 30 and the source contact 32, the gate contact 34, and the drain contact 36. This sacrificial layer could be an organic material, such as photoresist or polysilicon, or a metal, such as aluminum, chrome, copper, or nickel. The function of the first sacrificial layer is to set the appropriate, desired contact protrusion dimension. The notch 81 above the drain electrode 36 is produced by etching (described above). Typical spacing of this sacrificial layer is in the range of approximately 0.01 to 10 micrometers, and preferably approximately 1 micrometer.

Figure 7C:
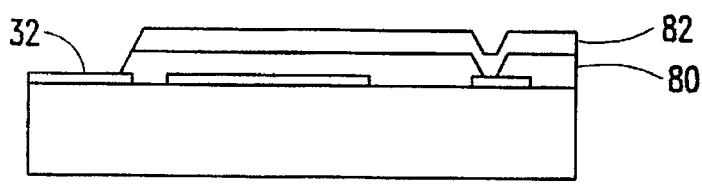

Next, as shown in FIG. 7C, a second sacrificial layer is deposited and patterned over the first sacrificial layer. The surface of the second sacrificial layer includes the notch 81 etched into the first sacrificial layer. This notch which will ultimately be used as a receptacle for the drain contact. At this stage, a portion of the combined sacrificial layers that cover the source electrode 32 is removed to expose the surface of the source electrode 32. The combination of the first and second sacrificial layers set the spacing between the beam and the gate electrode. Typical spacing of this second sacrificial layer is in the range of approximately 0.1 to 10 micrometers, and preferably approximately 1 micrometer. The total spacing between the gate electrode 34 and the top of the second sacrificial layer is approximately 0.2 to 20 micrometers, and preferably 2 micrometers.

Figure 7D:
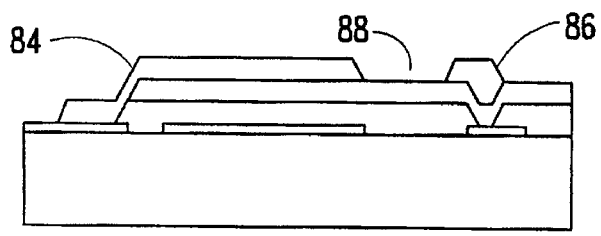

Next, as illustrated in FIG. 7D, the beam 84 and isolated contact 86 are deposited and patterned over the second sacrificial layer. As described above, the beam material may be nickel, gold, chrome, aluminum, or polysilicon, although any appropriate material may alternatively be implemented. The isolated contact 86 is deposited in the notch etched in the surface of the second sacrificial layer. The beam 84 is deposited by electroless plating on the second sacrificial layer and continues onto the surface of the source contact 32. Alternatively, the beam could have been deposited by an electroplating technique or other technique which may be patterned by liftoff or chemical etching. A gap 88 of approximately 10 microns separates the beam 84 and the isolated contact 86.

Figure 7E:
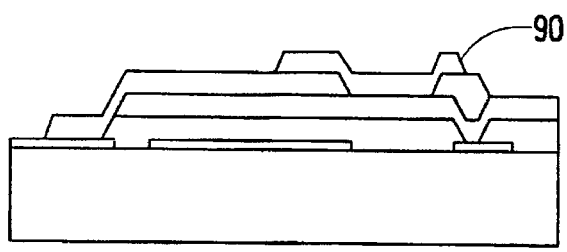

As illustrated in FIG. 7E, an insulator 90 is next deposited and patterned in the gap 88 between the beam 84 and the isolated contact 86. The deposited insulator material may be polyamide, polymethyl methacrylate (PMMA), or other suitable insulative material known in the art. The insulative material overlaps the beam 84 and the isolated contact 86 to form the final beam.

Figure 7F:
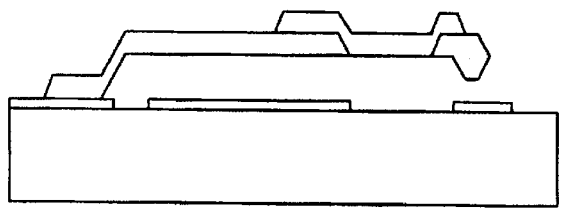

As illustrated in FIG. 7F, the sacrificial layers 80 and 82 are removed by etching or dissolving chemically to yield the final micromechanical switch. Etchants may include water, hydrogen peroxide, ammonium hydroxide, or other compound that is capable of dissolving the chosen sacrificial layers. Preferably, the etchant is chosen to dissolve the sacrificial layers and not the metals forming the beam and contacts.

The following examples describe detailed methods of making the micromechanical switches of the present invention using techniques known in the art. Although the examples describe methods of making a single beam switch, double beam switches, cantilevers, and diaphragm-type switches may be made using the techniques described herein coupled with ordinary skill in the art.

A three inch glass wafer is wiped clean of dust and particulates with acetone. The wafer is cleaned in an ultrasonic water bath for approximately 5 minutes, and subsequently washed in a 2:1 sulfuric acid-hydrogen peroxide mixture. The wafer is then dried in a dryer for approximately 3 minutes.

Approximately 300 Å of chrome, which may be used as an adhesion layer, approximately 1000 Å of gold, and approximately 300 Å of titanium-tungsten (TiW) are sputter deposited in succession using sputter deposition techniques known in the art. The TiW layer is used as a masking layer to allow the selective etching of the gold and chrome layer. The TiW layer reduces the amount of undercut of the gold layer. Photoresist is then applied to the wafer on a spinner, which applies a drop of liquid photoresist while spinning the wafer at a controlled velocity, for example from approximately 3000 rpm to 5000 rpm, thereby spreading the photoresist across the wafer in a near uniform layer. The photoresist is then patterned via a mask and a light, which can be either an electron beam, X-rays or Ultra-Violet (UV) light. This procedure produces developed areas of photoresist which can be used to protect the surface of the wafer from the effects of etching. The TiW, gold and chrome layers are next etched by commercial wet etchants, such as hydrofluoric acid (HF) or potassium iodide (KI). The gold layer is etched for a second time in order that the gold is etched back laterally over the chrome layer and does not "overhang" the chrome layer. The photoresist and the masking TiW layers are stripped from the wafer, leaving a plurality of gold-over-chrome areas which will be used as the gate, source, and drain contacts of the insulated micromechanical switch being fabricated.

Next, a pre-deposition cleaning is performed in a 2:1 sulfuric acid-hydrogen peroxide mixture. A layer of approximately 300 Å of TiW (used as an adhesion layer) is sputter deposited over the wafer surface, followed by deposition of approximately 1.5 microns of copper. These thicknesses may be varied in order to produce a desired gate-to-beam spacing dimension which influences the threshold voltage of the switch. The desired spacing dimension may be calculated from the physicochemical properties of the beam materials and the applied voltage. The copper sputtering is performed with the substrate biased by an RF voltage in order to achieve good step coverage over the chrome-gold pattern.

Photoresist is again spun on the wafer and patterned to define the tip contact regions. The copper layer is etched about halfway through its total thickness using a mixture of phosphoric acid, acetic acid, nitric acid, and water in a ratio of 80%/5%/5%/10% respectively. Since this is a timed etch, and is an isotropic process, it is important that the etch parameters, in particular the temperature of the etchant bath, is well-controlled. The photoresist is then stripped off and a new layer of photoresist is spun on. This layer of photoresist is patterned in order to define supports for the eventual released mechanical structures. The copper layer is etched through its total thickness with a suitable wet etchant. The TiW may be etched using hydrogen peroxide.

Photoresist is spun on and patterned to define the mask for plating the beams. It is important to make sure that photoresist inside the wells in the sacrificial layer which subsequently form the supports for the beam is developed away completely, otherwise the corners of the cavities retain excess photoresist material which may lead to weakened support for the beam. The patterned photoresist is baked at 150° C. to improve its chemical resistance during the plating steps.

A pre-clean is performed in 10% aqueous hydrochloric acid. A layer of gold approximately 2000 Å thick is deposited by electroless plating, using a commercial electroless plating solution. A pre-clean is again performed in 10% aqueous hydrochloric acid prior to depositing a layer of Nickel (Ni) about 1 micron thick by electroplating from a commercial electroplating solution containing Ni. The thickness of the Ni layer is chosen to achieve desired device characteristics, such as resonant frequency, threshold voltage, etc.

Since both the electroplating and electroless plating rates are exponentially related to the temperature, it is important that the temperature be well controlled in these steps. Typical plating temperatures range from approximately 40° C. to 100° C. The Ph of the plating solutions should be monitored and adjusted to the desired operating values periodically, typically on a daily basis. The pH range preferably is acidic, in the range of approximately 2–6.8. The pH of the electroless gold solution and nickel electroplating solution may be adjusted downward by addition of sulfuric acid. The pH of the nickel electroplating solution may be increased by addition of nickel carbonate solution.

The other control parameters relating to the electroplating process are amplitude, frequency and duty cycle of the pulse applied to the plating bath. These parameters should be monitored and maintained at the determined operating values in order to achieve the desired results. In an exemplary embodiment, a frequency from 10 to 10 KHz and a 10% to 90% duty cycle. The amplitude is adjusted to provide an average density on the order of the manufacturers specification.

The sacrificial layers (Cu and TiW) are etched in a mixture of approximately 40 parts water, 1 part hydrogen peroxide, and 8 parts ammonium hydroxide. The etching solution is preferably replaced with fresh solution about halfway through the etch, in order that the solution is not exhausted of active reagents before the etch is completed. For the same reason, a minimum ratio of etchant volume to sample area should be maintained. Using the techniques described herein, up to about 2–3 square centimeters sample area is etched in a volume of approximately 1.8 liters of solution. Following the etch, a short clean is carried out in water, hydrogen peroxide and ammonium hydroxide in the ratio of approximately 5:1:1. This step is necessary to ensure that the surface of the gold is free of any residues from the sacrificial layer etch. The sample that has been etched is then rinsed in isopropyl alcohol and then dried on a hotplate at 200° C.

Figure 8A:
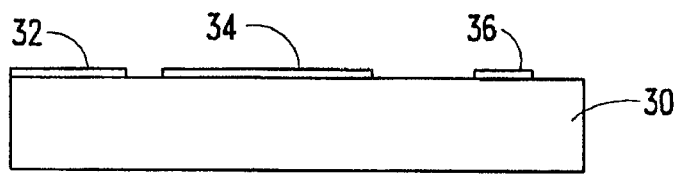
FIGS. 8A–8F show the steps of a method to make the embodiment of the invention shown in FIGS. 3A and 3B.
Figure 8B:
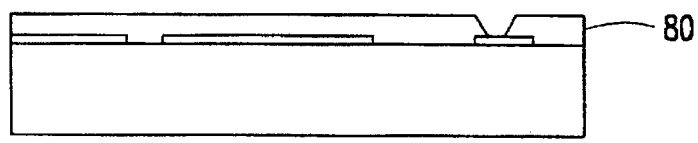
Figure 8C:
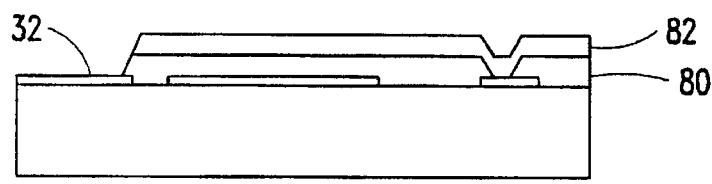

The device shown in FIGS. 3A and 3B implementing a fully insulated beam may be fabricated using similar micromachining techniques as illustrated in FIGS. 8A–8F. In this embodiment, the insulating layer preferably has electrically conductive plates incorporated into the beam. As shown in FIG. 8A, lower contact layers are first deposited on a substrate 30 and include a source contact area 32, a gate contact area 34, and a drain contact area 36. Such contact layers may be deposited by any of the methods used above, such as sputtering or vapor deposition. As shown in FIG. 8B, a first sacrificial layer 80 is next deposited onto the contact layers 32, 34, and 36. A notch is etched into the first sacrificial layer above the drain contact, and a portion of the sacrificial layer covering the source contact 32 is removed. A second sacrificial layer is deposited over the first sacrificial layer, as illustrated in FIG. 8C. Each sacrificial layer is 0.1 to 10 micrometers thick, and preferably 1 micrometer thick.

Figure 8D:
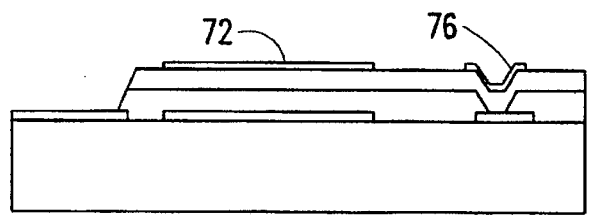

An upper electrode layer 72 and an upper contact layer 76 are next deposited on the second sacrificial layer as shown in FIG. 8D. The upper electrode layer 72 and the upper contact layer 76 are positioned above the gate contact 34 and the drain contact 36, respectively. The upper contact layer 76 is deposited to coat the notch that will eventually form the isolated contact. Like the aforementioned embodiment, a preferred material for the upper electrode and the upper contacts is chromium, although other conductive metals are also possible. The upper electrode and upper contact may be deposited by vacuum deposition, sputtering, or similar techniques known in the art.

Figure 8E:
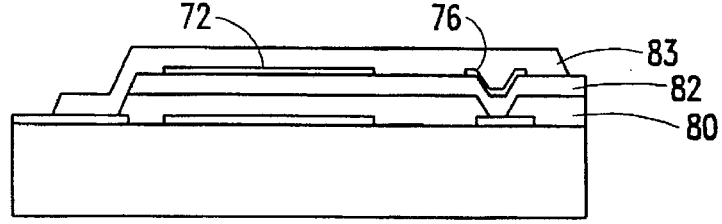
Figure 8F:
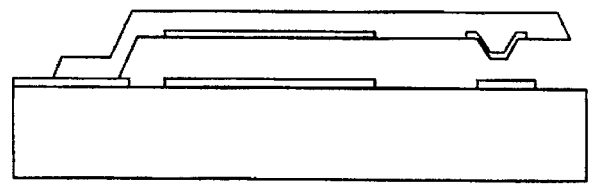

As shown in FIG. 8E, insulating beam material 83 is next deposited over the upper electrode layer 72 and upper contact layer 76 to form an insulating beam that is attached to the source contact 32. The insulating material that forms the beam 83 may be polyamide, PMMA, or other suitable insulative material known in the art, and is approximately 100 nm to 10 µm thick. As is shown in FIG. 8E, the insulating beam insulates the upper electrode layer 72 from the upper contact layer 76. Lastly, as illustrated in FIG. 8F, the first and second sacrificial layers 80 and 82 are removed.

An exemplary device made by the methods according to the invention features a beam length of 10 µm, a beam width of 2 µm, a beam thickness of 0.4 µm and a beam-to-gate spacing of 0.4 µm. A beam of this size has a resistance of approximately 0.55 ohms. The turn-on voltage for such a device is approximately 29 volts, and the turn-off voltage is approximately 16 volts. A device with these parameters has an operational frequency of approximately 2 MHz.

Micromechanical switches of the present invention can be switched at frequencies of approximately 2 MHz. The device and method of the present invention have broad uses. The insulated micromechanical switch of the invention may be used as a memory element, or in applications where use of small contact area relative to gate area to enhance contact pressure is required. The device can be micromachined as a small unit to conceivably compete with microelectronics. The device is also capable of high speed performance.

Figure 9:
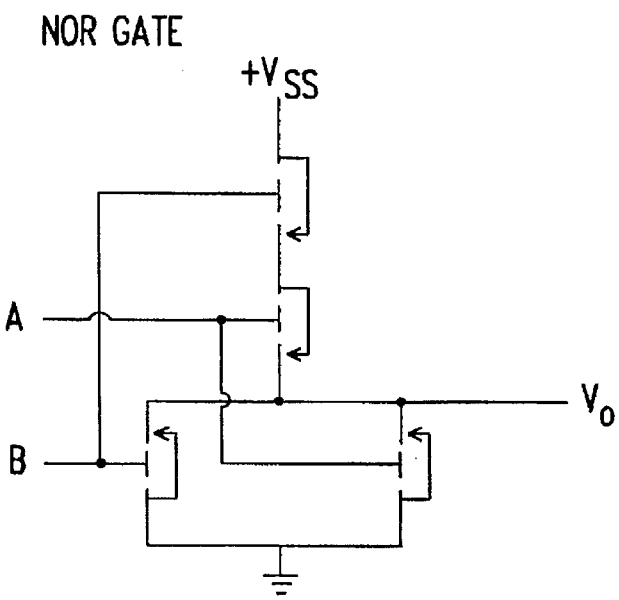
FIG. 9 is a circuit schematic of a NOR gate using micromechanical switches.
Figure 10:
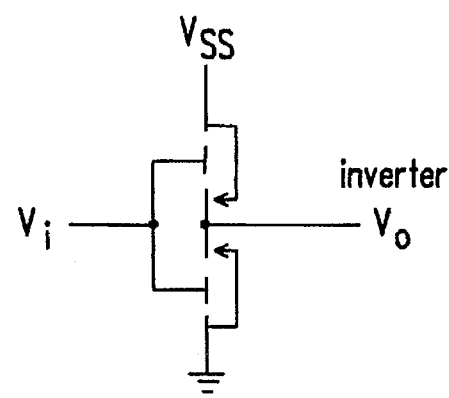
FIG. 10 is a circuit schematic of an inverter using micromechanical switches.
Figure 11:
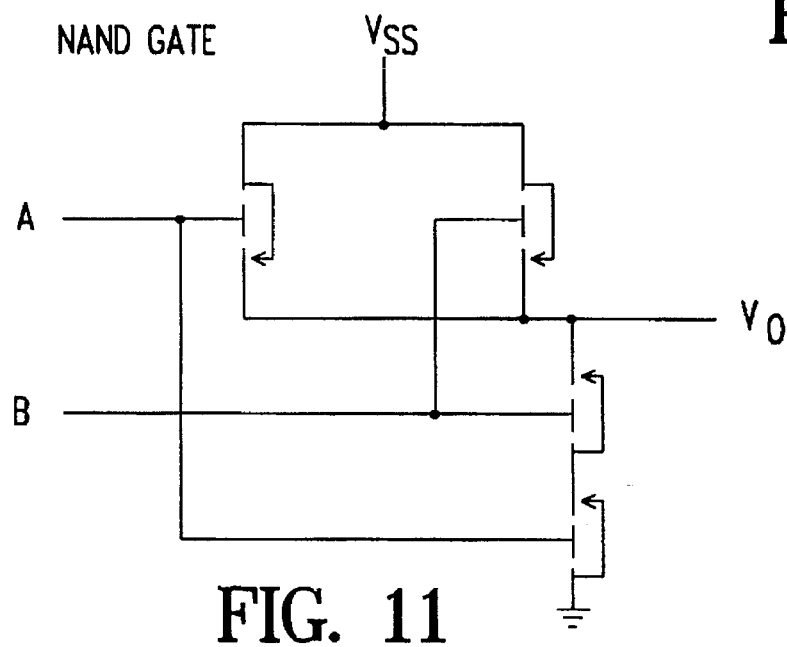
FIG. 11 is a circuit schematic of a NAND gate using micromechanical switches.

FIGS. 9-11 show another use of the micromechanical switch as elements of logic gates. In FIG. 9 a NOR gate is implemented using 4 micromechanical switches. FIG. 10 shows an inverter comprised of two micromechanical switches. FIG. 11 shows a NAND gate implemented in 4 micromechanical switches. Other logic elements could be built as well using various configuration of micromechanical switches.

Figure 12:
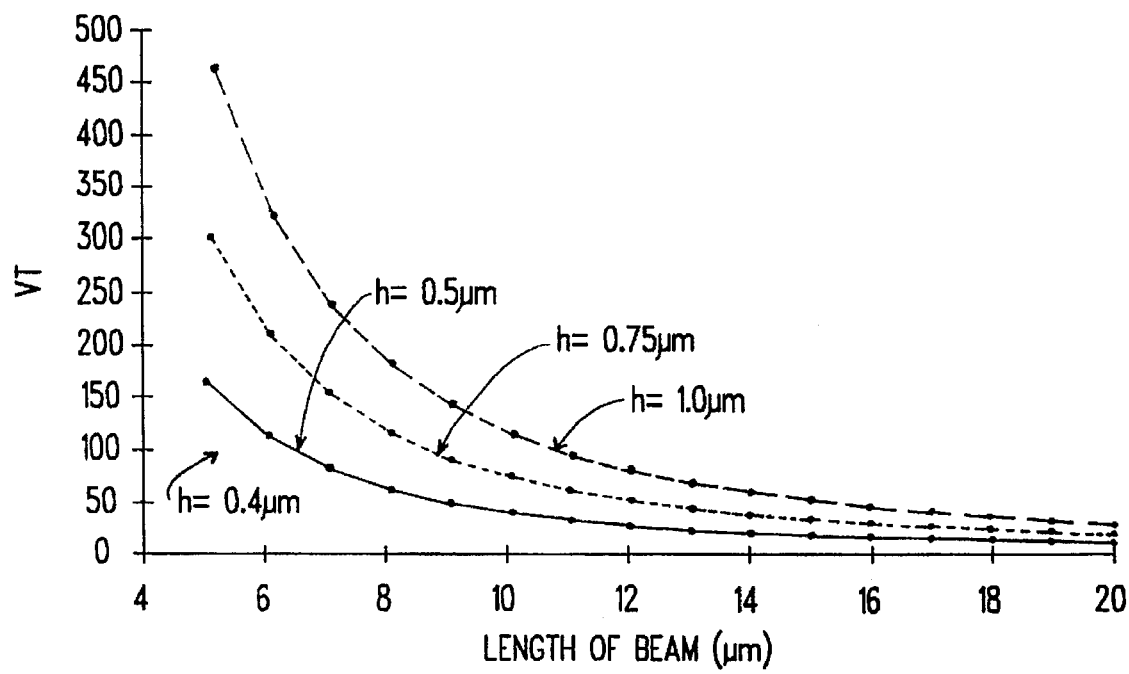
FIG. 12 is a graph relating threshold voltage ($V_t$) and beam length for different beam thicknesses.
Figure 13:
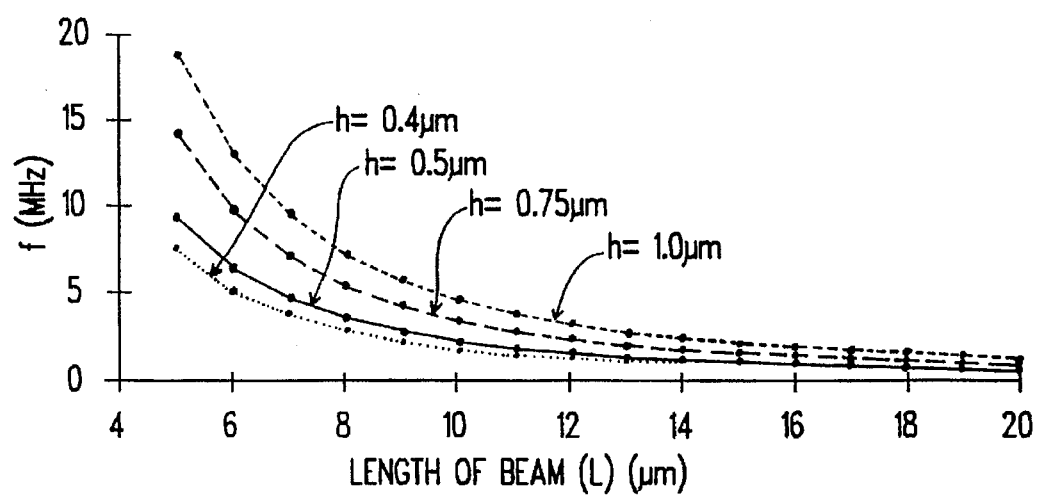
FIG. 13 is a graph relating switching frequency to beam length for different beam thicknesses.

As discussed above, the length of the beam is an important parameter in the construction of the micromechanical switches of the invention. FIG. 12 illustrates the relationship between the threshold voltage ($V_t$) for switching a micromechanical switch as a function of the length of the beam. The four curves represent different beam thicknesses (h) ranging from 0.4 to 1.0 micrometer. For each exemplary beam thickness, FIG. 12 shows that as the length of the beam decreases, the threshold voltage $V_t$ required to deflect the beam to the closed position increase. In addition, for any particular beam length, as the beam thickness increases, $V_t$ also increases. FIG. 13 is a graph representing the relationship between switching frequency and beam length for the same four beam thicknesses (h). As shown in FIG. 13, as beam length decreases, the corresponding frequency at which the device can be switched increases. In addition, for any particular beam length, as beam thickness increases, switching frequency also increases.

Although the invention has been shown and described with respect to an illustrative embodiment thereof, it should be appreciated that the foregoing and various other changes, omissions, and additions in the form and detail thereof may be made without departing from the spirit and scope of the invention as delineated in the claims.

What is claimed is:

1. An insulated micromechanical switch comprising:

a substrate;

a source contact mounted on said substrate;

a gate contact mounted on said substrate;

a drain contact having a first drain electrode and a second drain electrode, said drain contact mounted on said substrate;

a deflectable beam comprising:

a conductive beam body having a first end and a second end, said first end of said beam body attached to said source contact, said second end of said beam body overhanging said gate contact;

a beam contact overhanging said drain contact; and an insulator joining and electrically insulating said second end of said beam body and said beam contact; and wherein said beam is deflectable between a first position in which said beam contact is in electrical communication with said drain contact in response to an electrical field of a first strength established between said gate electrode and said conductive beam body, to a second position in which said beam contact is isolated from said drain contact in response to an electrical field of a second strength established between said gate electrode and said conductive beam body.

2. The insulated micromechanical switch of claim 1, wherein said substrate comprises silicon or glass.

3. The insulated micromechanical switch of claim 1, wherein said beam body comprises nickel, gold, chrome, chromium, copper or iron.

4. The insulated micromechanical switch of claim 1, wherein said insulator comprises polyimide, PMMA, silicon nitride or silicon oxide.

5. The insulated micromechanical switch of claim 1, wherein said contacts comprise platinum, palladium, titanium/tungsten, rhodium or gold.

6. The insulated micromechanical switch of claim 1, wherein said beam has a length of between 5 μm and 20 μm.

7. The insulated micromechanical switch of claim 1, wherein said insulated micromechanical switch is incorporated into an electrical circuit.

8. An insulated micromechanical switch, comprising:

a substrate;

a source electrode mounted on said substrate;

a gate contact comprising a first gate electrode and a second gate electrode, said gate contact mounted on said substrate adjacent said source electrode, said first gate electrode and said second gate electrode separated by a channel;

a drain contact comprising a first drain electrode and a second drain electrode mounted on said substrate adjacent said gate contact;

a non-conductive deflectable beam mounted on said source electrode and overhanging said gate contact and said drain electrodes, said beam comprising an upper electrode layer and an upper contact layer, said upper electrode layer positioned on said beam over said gate contact and said upper contact layer positioned on said beam over said drain contact, said beam electrically insulating said upper contact layer from said upper electrode layer; and wherein said beam is deflectable between a first position wherein said upper contact layer is in electrical communication with said drain electrodes in response to an electrical field of a first strength established between said first gate electrode and said second gate electrode, to a second position wherein said upper contact layer is isolated from said drain electrodes in response to an electrical field of a second strength established between said first gate electrode and said second gate electrode.

9. The insulated micromechanical switch of claim 8, wherein said substrate comprises silicon or glass.

10. The insulated micromechanical switch of claim 8, wherein said beam body comprises nickel, gold, chrome, chromium, copper or iron.

11. The insulated micromechanical switch of claim 8, wherein said insulator comprises polyimide, PMMA, silicon nitride or silicon oxide.

12. The insulated micromechanical switch of claim 8, wherein said contacts comprise platinum, palladium, titanium/tungsten, rhodium or gold.

13. The insulated micromechanical switch of claim 8, wherein said beam has a length of between 5 μm and 20 μm.

14. The insulated micromechanical switch of claim 8, wherein said insulated micromechanical switch is incorporated into an electrical circuit.

* * * * *